United States Patent
Yu et al.

[11] Patent Number: 5,831,316
[45] Date of Patent: *Nov. 3, 1998

[54] MULTI-FINGER MOS TRANSISTOR ELEMENT

[75] Inventors: Ta-Lee Yu, Hsinchu Hsien; Konrad Young, Taipei, both of Taiwan

[73] Assignee: Winbond Electronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 778,081

[22] Filed: Jan. 2, 1997

[30] Foreign Application Priority Data

Nov. 25, 1996 [TW] Taiwan ................... 85114536

[51] Int. Cl.$^6$ ................... H01L 29/00
[52] U.S. Cl. ............... 257/401; 257/355; 257/357; 257/375
[58] Field of Search ................... 257/401, 355, 257/546, 357, 375

[56] References Cited

U.S. PATENT DOCUMENTS

| | | | |
|---|---|---|---|
| 5,146,112 | 9/1992 | Ito et al. ................... | 257/357 |
| 5,151,767 | 9/1992 | Wong ................... | 257/355 |
| 5,235,201 | 8/1993 | Honna ................... | 257/357 |
| 5,323,043 | 6/1994 | Kimura et al. ................... | 257/375 |
| 5,404,041 | 4/1995 | Diaz et al. ................... | 257/360 |
| 5,612,566 | 3/1997 | Williams ................... | 257/402 |
| 5,623,156 | 4/1997 | Watt ................... | 257/546 |

OTHER PUBLICATIONS

Chen et al., "Design and Layout of a High ESD Performance NPN Sructure for Submicron BiCMOS/Bipolar Circuits", IEEE, 227–232, (1996).

Hsu et al., "An Analytical Breakdown Model for Short–Channel MOSFET's", IEEE Transactions on Electron Devices, 29(11):1735–1739, (1982).

Polgreen et al., "Improving the ESD Failure Threshold of Silicided n–MOS Output Transistors by Ensuring Uniform Current Flow", IEEE, 379–388, (1992).

*Primary Examiner*—Valencia Wallace
*Attorney, Agent, or Firm*—Fish & Richardson P.C.

[57] ABSTRACT

A multi-finger MOS transistor element is provided in which all of the base resistance values of parasitic bipolar transistors (NPN, if an NMOS, or PNP, if a PMOS transistor) in each finger MOS are equal to each other. Thus, each finger MOS transistor element in the multi-finger MOS transistor is turned on simultaneously to enhance ESD protection performance. In the multi-finger MOS transistor, the diffusion region for providing the well/substrate contact is distributed in the source region to make the base resistance value of the parasitic NPN (or PNP) transistor in each finger MOS equal to each other.

The multi-finger MOS of the invention includes a plurality of drain regions, each having drain contacts, a plurality of source regions, each having source contacts, and a plurality of gate regions, wherein each gate region is between each drain region and the source region; a bias diffusion region formed in the source region along a middle line which is equally spaced between the pair of gate regions.

9 Claims, 5 Drawing Sheets

MULTI-FINGER MOS TRANSISTOR ELEMENT

BACKGROUND OF THE INVENTION

1. Field of the Invention

The present invention relates generally to a multi-finger MOS transistor element, and particularly to a multi-finger metal oxide semiconductor (MOS) element for ESD (electrostatic discharge) protection of an MOS integrated circuit (IC).

2. Description of the Related Art

The CMOS transistor has been applied in integrated circuits of a wide variety of applications. With the continued development of semiconductor technology, the size of the internal element in the IC is made smaller and smaller. The internal MOS transistor element in the IC is sensitive to external electrostatic forces because of its thin gate oxide layer. ESD existing in the measuring, packaging, setting-up, and implementing in the IC can damage the IC, thereby having an indirect effect on the electronic system of which it is a part of. Typically, during normal operation of the IC, the ESD protection circuit is positioned at the input, the output, and especially where a metal junction pad is nearby, in order to prevent the electrostatic force from affecting and damaging the circuit.

FIG. 1 shows a conventional ESD protection circuit 10 for protecting the input, the output, and power source in an MOS IC technology. An NMOS transistor 12 is connected between a junction pad 14, and GND 16. A gate 18 of the NMOS transistor 12 is connected to a driving circuit 20 connected to junction pad 14 and GND 16. The NMOS transistor 12 generally has a multi-finger configuration for the purpose of handling a large ESD current in the NMOS transistor 12, when the gate is not widened. FIG. 2A shows a partial layout of a traditional multi-finger NMOS transistor, wherein 100 is a P-well region within a substrate, 101 is a source active region of $N^+$ type, 102 is a drain active region of $N^+$ type, 103 is a $P^+$ diffusion region for the P-well/substrate contact for providing the bias, 104 is a gate region, 105 is a drain contact, 106 is a source contact, and 107 is a $P^+$ diffusion contact. In general, the $P^+$ diffusion region 103 provides a bias to the P-well region 100, by connecting the P-well and the source of the NMOS transistor element to the substrate. The multi-finger NMOS transistor mainly uses identical, parallel MOS transistors, and parasitic NPN transistors to provide ESD protection. Thus the circuit is protected from EDS damage. However, the nonuniform turn-on of each finger of the MOS transistor will degrade the ESD protection, particularly when using a self-aligned silicide process (salicide) as discussed in Thomas L. et al, "Improving the ESD Failure Threshold of Silicided n-MOS Output Transistors by Uniform Current Flow", IEEE Trans. Electron Devices. Vol. 39. NO. 2. February 1992.)

FIG. 2B shows a cross-sectional view of a portion of the traditional multi-finger NMOS transistor layout of FIG. 1. As shown in FIG. 2B, finger MOS1 of the MOS transistor has a parasitic NPN transistor Q1, and a base resistance R1; and finger MOS2 of the MOS transistor has a parasitic NPN transistor Q2, and a base resistance R2. The $P^+$ diffusion region 103 of the MOS transistor is connected to the source region 101, and the substrate. During the process for example, a packaging process, an ESD stress will be produced between the drain, and the source of the MOS. The junction voltage between the collector C, and the base B will make the parasitic NPN transistor Q1, and Q2 breakdown, and thus turn them on. The electrostatic discharge current flows through the junctions between collectors C, and bases B, of transistors Q1 and Q2 and the resistance R1, and resistance R2 respectively, forming a discharge path to prevent damage to the internal circuit. Thus, if ESD stress occurs during junction breakdown of Q1, and Q2, the electron discharge current is divided equally between finger MOS1 and finger MOS2. This ESD protection is preferred because of the uniform turn-on of fingers MOS1 and MOS2. The junction breakdown voltage value VCB will determine the conduction time of ESD current. As described by Hsu et al, "An Analytical Breakdown Model for Short-Channel MOSFET'S" IEEE Trans. Electron Device November 1982, the base resistance will affect the junction voltage value. When ESD stress occurs, whether each finger in a multi-finger NMOS is uniformly turned-on depends on whether the base resistance of the respective parasitic NPN transistors is equal to each other. As shown in FIG. 2B, the distance from the base of transistor Q1 to the $P^+$ diffusion region is much greater than that from the base of transistor Q2 to $P^+$ diffusion region. Thus, the resistance value of R1 is greater than that of R2, and finger MOS1 and finger MOS2 will not be uniformly turned-on. The ESD protection, is therefore, reduced. The greater the number of finger MOSs, the more difficult it is to uniformly turn-on each finger MOS.

Similarly, when a multi-finger PMOS is provided, a nonuniform base resistance of the parasitic PNP transistor of the multi-finger PMOS will cause a nonuniform turn-on, thereby affecting the ESD protection of the MOS IC.

SUMMARY OF THE INVENTION

One object of the present invention is to provide a multi-finger MOS transistor element where the base resistance of the parasitic NPN transistor in each finger of the transistor MOS is equal to each other so that each finger MOS of the multi-finger MOS transistor reaches uniform turn-on more easily, thereby enhancing ESD protection performance.

In the multi-finger MOS transistor of the invention, the bias diffusion region for providing the well/substrate contact is distributed in the source region of the NMOS transistor or the source region of PMOS transistor to make the base resistance value of the parasitic NPN or PNP transistor in each finger MOS equal to each other. Thus, ESD protection performance is enhanced.

A multi-finger MOS transistor element is provided. All of the base resistance values of all of the parasitic bipolar transistors (NPN, in an NMOS application, or PNP, in a PMOS application) in each finger MOS are equal to each other. It makes each finger MOS in the multi-finger MOS easier to reach uniform turn-on simultaneously, and thus to enhance the ESD protection performance.

The multi-finger MOS of the invention comprises a plurality of drain regions, each having a plurality of drain contacts, a plurality of source regions, each having a plurality of source contacts, and a plurality of gate regions, wherein each gate region is between each drain region and the source region; drain contacts, formed in each drain region; and source contacts together with at least one bias diffusion region formed in the source region, wherein each bias diffusion region is located on a middle line equally spaced between every pair of gate regions and the distance between the source contacts and the gate regions is no more than 6 µm. The source contacts are formed in the source region and positioned a predetermined distance between the gate regions.

DESCRIPTION OF THE DRAWINGS

Other objects, features, and advantages of the present invention will become apparent from the following detailed description is made with reference but non-limiting embodiment. The description is made with reference to the accompanying drawings, in which.

DESCRIPTION OF THE PREFERRED EMBODIMENT

Embodiment One:

In accordance with a multi-finger NMOS transistor of the present invention, the P+ diffusion region for providing a bias to the P-well/substrate is formed along a middle line which is equally spaced between two gate regions. The base resistance of each parasitic NPN transistors formed in the P-well is equal to each other, so that the difference between the junction voltage of each parasitic NPN transistor is small and ensures that each finger NMOS can be uniformly turned-on to enhance the ESD protection.

Figure 1:
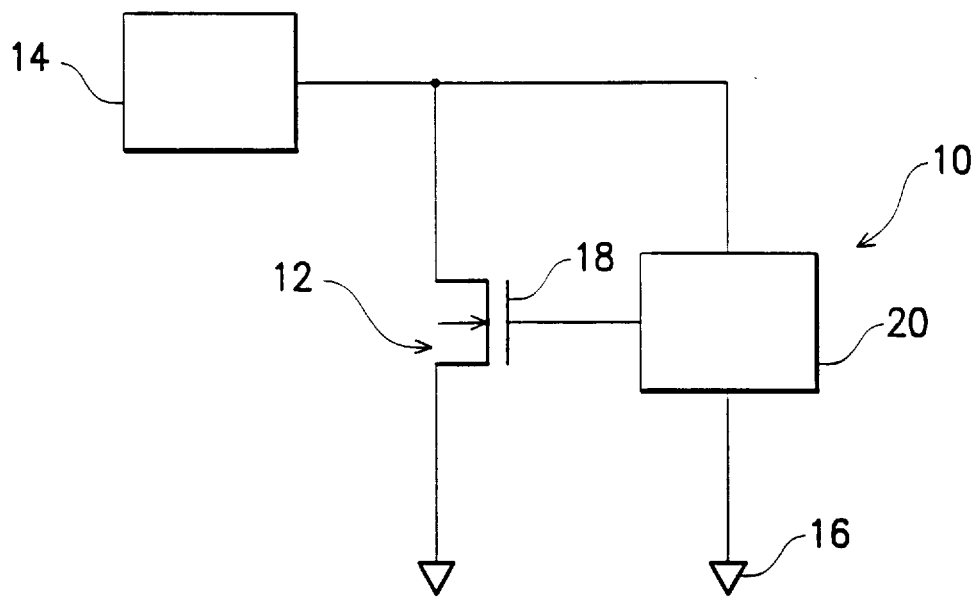
FIG. 1 shows a general ESD protection circuit for use at the input, the output, and the voltage source in an IC.
Figure 2A:
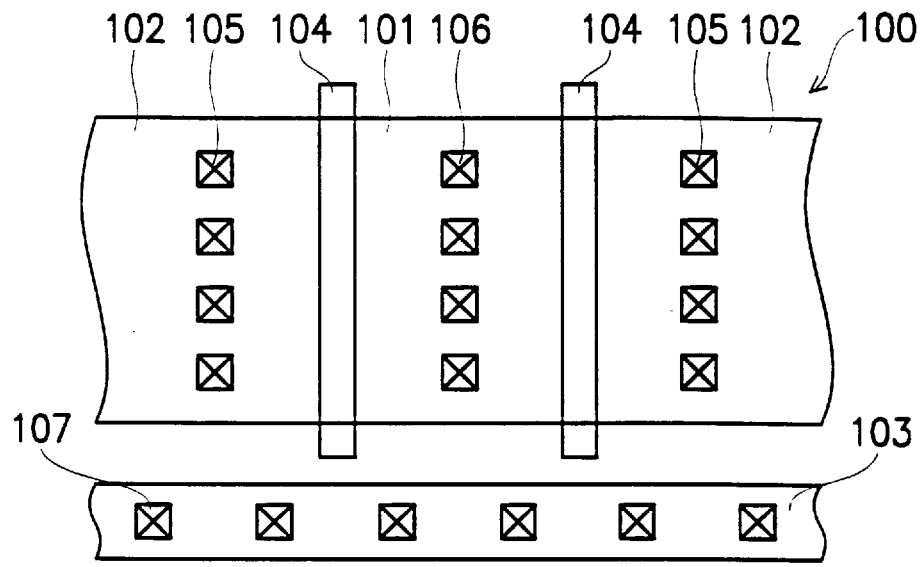
FIG. 2A, and FIG. 2B show, respectively, a partial layout and cross-sectional view of a conventional multi-finger NMOS transistor.
Figure 2B:
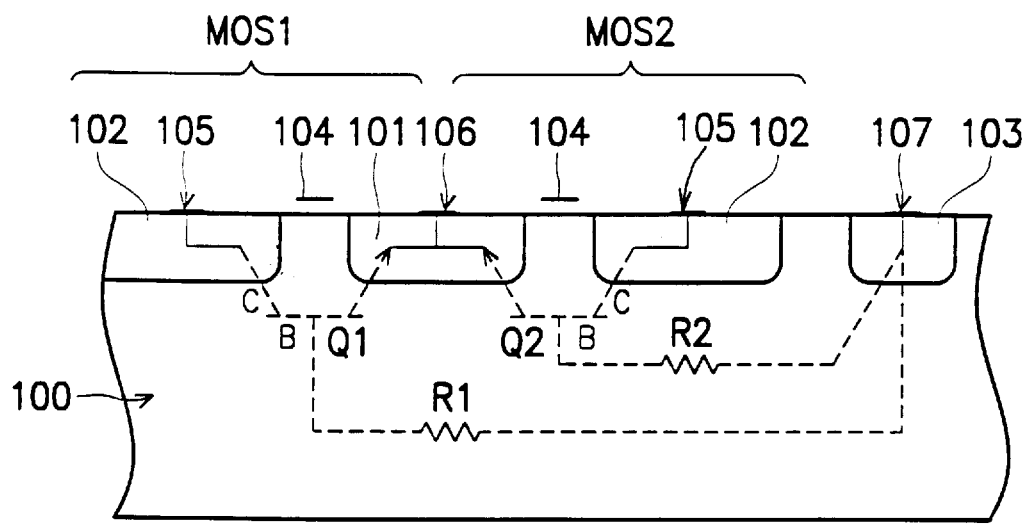
Figure 3A:
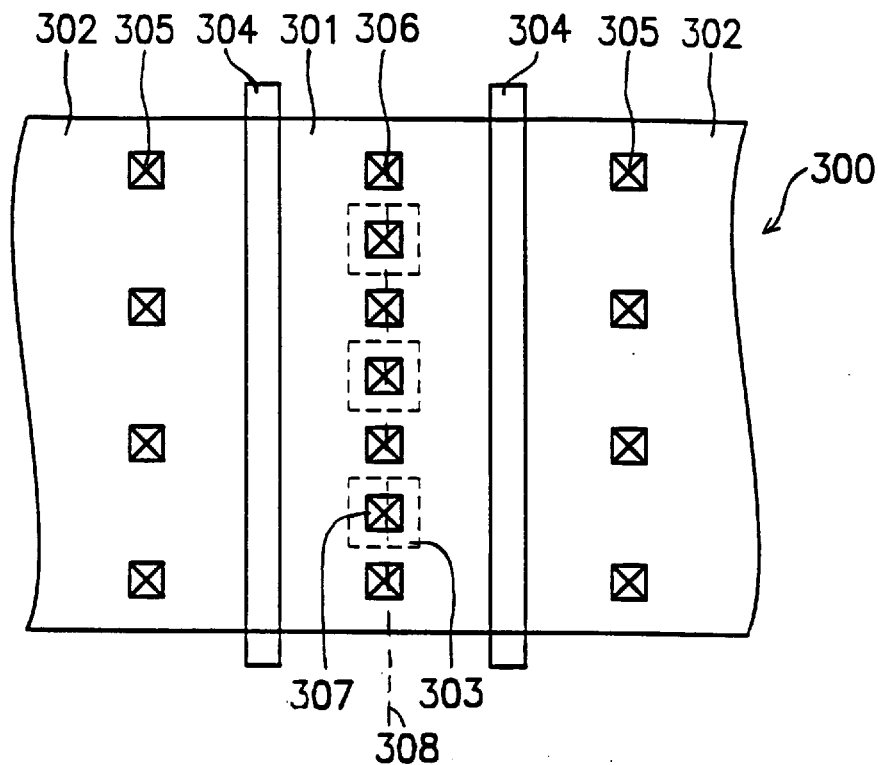
FIG. 3A, and FIG. 3B show, respectively, a partial layout and a related cross-sectional view of one embodiment of the present invention.

As shown in FIG. 3A, a multi-finger NMOS transistor 300 is shown according to the present invention. The multi-finger NMOS transistor 300 comprises drain regions 302, a source region 301, and gate region 304, formed in a P-well region 309, (shown in FIG. 3B) each gate region 304 being between each drain region 302 and source region 301; drain contacts 305, formed in each drain region 302; and source contacts 306 together with P+ diffusion regions 303, formed in the source region 301, wherein P+ diffusion region contacts 307 are formed in P+ diffusion region 303.

Figure 3B:
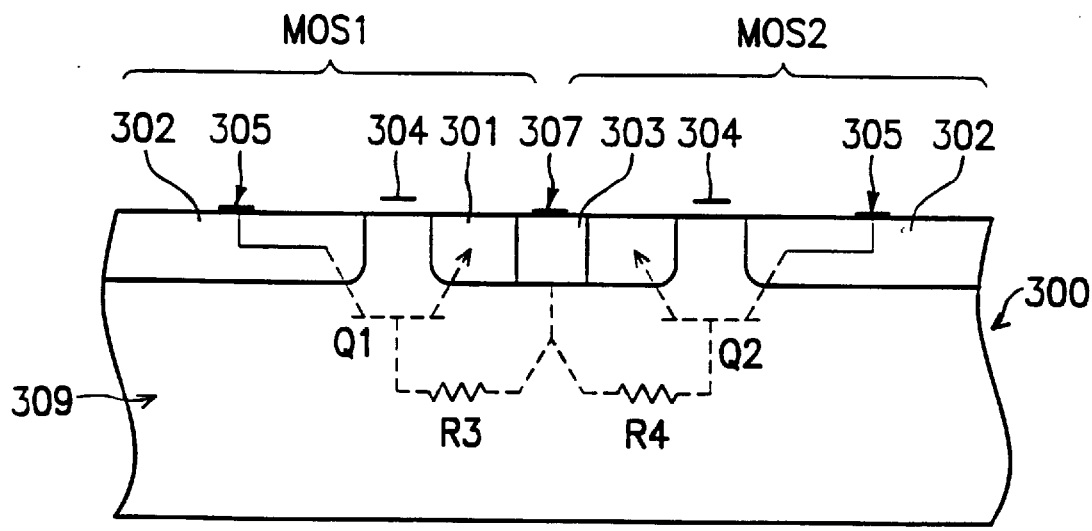

As shown in FIG. 3A, the P+ diffusion region 303, and the source contacts 306 are aligned along a line 308 in the source region 301 which extends between gate regions 304. The line is equally spaced between the two gate regions 304. A P+ diffusion region 303 is located between every two source contacts. Distributing the P+ diffusion regions 303 in this way makes the base resistance of each parasitic NPN transistor equal to each other, so that the turn-on of the NMOS transistor is more uniform. FIG. 3B is a cross-sectional view of this embodiment. Because the P+ diffusion region 303 is located on the middle line of the source region 301, the difference between the value of the base resistance R3, and that of the base resistance R4 is small, thus ESD protection performance is enhanced.

Figure 4:
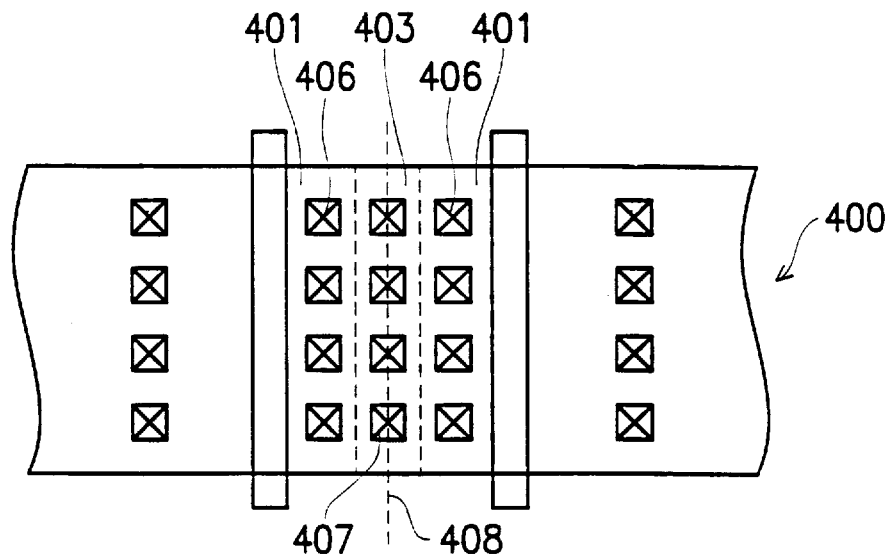
FIG. 4 shows a partial layout of another embodiment of the present invention.

Embodiment Two:

FIG. 4 shows a partial layout of another embodiment of the present invention in which a multi-finger NMOS transistor 400 has only one P+ diffusion region 403 formed along a middle line 408 in the source region 401. The P+ diffusion region 403 on the middle line is a rectangular region. The P+ diffusion region contacts 407 are in the P+ diffusion region 403. The P+ diffusion region contacts 407, and the source contacts 406 formed on either side of the diffusion region are configured in an array, as shown in FIG. 4.

Figure 5:
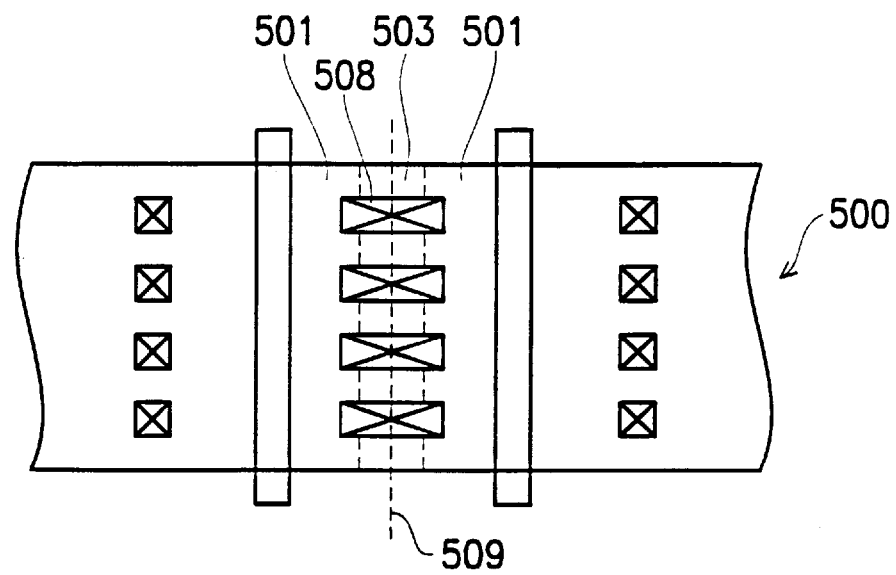
FIG. 5 shows a partial layout of another embodiment of the present invention.

Embodiment Three:

FIG. 5 shows a partial layout of another embodiment of the present invention. As was the case in the multi-finger NMOS transistor of FIG. 4, only one P+ diffusion region 503 is formed along a middle line 509 in the source region 501. The P+ diffusion region 503 on the middle line is a rectangular region. The source region 501 is electrically connected to the P+ diffusion region 503 via butted contacts 508.

Figure 6:
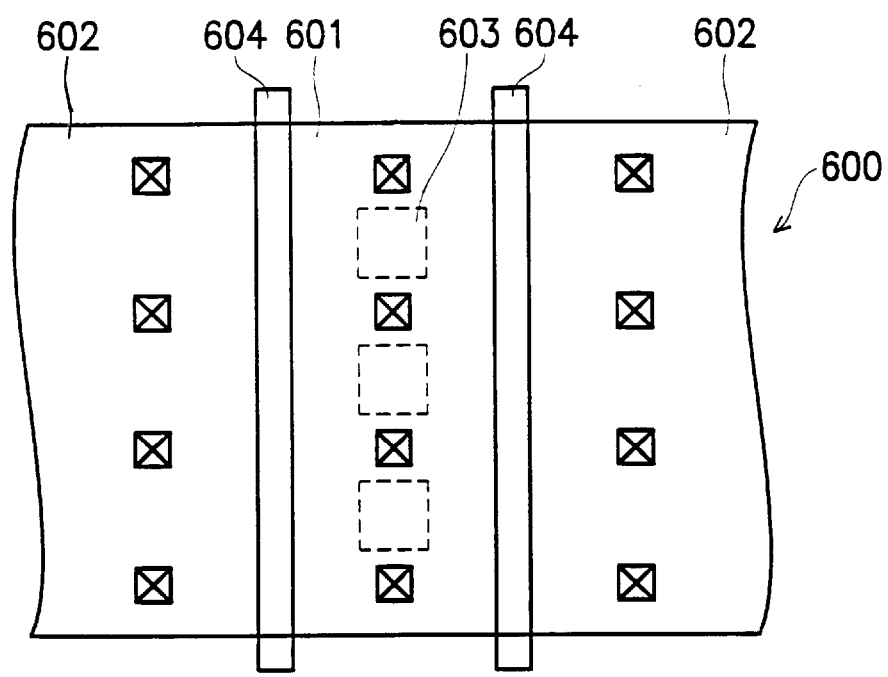
FIG. 6 shows a partial layout of still another embodiment of the present invention.

Embodiment Four:

When the multi-finger NMOS 600 is formed through a salicide process, a $TiSi_2$ layer having good conductivity is formed on the source region 601, the drain regions 602, and the gate regions 604. The P+ diffusion region 603 in the source region 601 provides a good electrical connection to the source via the $TiSi_2$ layer. Thus, in a multi-finger NMOS transistor formed through the salicide process, the fabrication of the P+ diffusion region is not required. FIG. 6 shows the layout of Embodiment One (FIG. 3A, 3B) in which forming the P+ diffusion region after the salicide process is skipped.

Each of the above embodiments is directed to a multi-finger NMOS transistor, however, the present invention is also applicable to a PMOS transistor having multi-finger MOS transistor element with an N+ diffusion region as a bias diffusion region.

Although only two finger MOS element are shown in each above embodiment, the present invention is also applicable to a plurality of finger MOS elements.

What is claimed is:

1. A multi-finger MOS transistor element, comprising:
   a source region, a plurality of drain regions, and a plurality of gate regions, each gate region disposed between a corresponding one of the drain regions and the source region;
   a plurality of drain region contacts formed in each corresponding drain region;
   a plurality of source contacts formed in the source region and positioned a predetermined distance between the gate regions; and
   at least a bias diffusion region formed in the source region along a middle line which is equally spaced between a closest pair of said gate regions, wherein said bias diffusion has an outer perimeter that is bounded by said source region.

2. The multi-finger MOS transistor element of claim 1, further comprising a plurality of bias diffusion regions, each bias diffusion region located between every pair of source contacts; and having a plurality of bias diffusion region contacts formed on each bias diffusion region.

3. The multi-finger MOS transistor element of claim 1, further comprising a plurality of bias diffusion region contacts formed in the bias diffusion region, wherein the bias diffusion region is a rectangular region formed on the middle line; said source contacts being formed on two sides of the bias diffusion region; the source contacts and the bias diffusion region contacts formed in an array.

4. The multi-finger MOS transistor element of claim 1, further comprising a plurality of bias diffusion regions without bias diffusion region contacts, wherein said source contacts are lined up on said middle line; each of said bias diffusion regions being located between a drain contact in a first one of the drain regions and another drain contact in a second one of the drain contacts of every two drain contacts.

5. The multi-finger MOS transistor element of claim 3, further comprising a butted contact formed along the middle line in the rectangular region between the source contacts and said bias diffusion region contacts.

6. The multi-finger MOS transistor element of claim 1, wherein the predetermined distance is no more than 6 μm.

7. The multi-finger MOS transistor element of claim 1, wherein the drain contacts are aligned along a line in each drain region.

8. The multi-finger MOS transistor element of claim 1, wherein said multi-finger MOS transistor element has a $P^+$ diffusion region as a bias diffusion region when said multi-finger MOS is an NMOS transistor element.

9. The multi-finger MOS transistor element of claim 1, wherein said multi-finger MOS transistor element has an $N^+$ diffusion region as a bias diffusion region when said multi-finger MOS is a PMOS transistor element.

* * * * *